United States Patent
Marque-Pucheu

(10) Patent No.: US 7,024,167 B2
(45) Date of Patent: Apr. 4, 2006

(54) METHOD FOR AMPLITUDE MODULATION OF A RADIO FREQUENCY SIGNAL, AND DEVICE THEREFOR

(75) Inventor: Gérard Marque-Pucheu, Verneuil sur Seine (FR)

(73) Assignee: Nortel Networks France, Chateaufort (FR)

( * ) Notice: Subject to any disclaimer, the term of this patent is extended or adjusted under 35 U.S.C. 154(b) by 277 days.

(21) Appl. No.: 10/480,670

(22) PCT Filed: Jun. 5, 2002

(86) PCT No.: PCT/FR02/01916

§ 371 (c)(1),
(2), (4) Date: Dec. 12, 2003

(87) PCT Pub. No.: WO02/101916

PCT Pub. Date: Dec. 19, 2002

(65) Prior Publication Data

US 2004/0162039 A1     Aug. 19, 2004

(30) Foreign Application Priority Data

Jun. 13, 2001 (FR) .................................. 01 07746

(51) Int. Cl.
*H03C 1/52* (2006.01)
*H04B 1/04* (2006.01)
*H01Q 11/12* (2006.01)

(52) U.S. Cl. .................... 455/108; 455/110; 455/127.2

(58) Field of Classification Search ............. 455/91, 455/108, 114.1, 126, 127.1, 127.2, 110; 375/345; 330/278, 291

See application file for complete search history.

(56) References Cited

U.S. PATENT DOCUMENTS

| 3,668,533 A | * | 6/1972 | Fish et al. | 327/306 |
| 5,276,921 A | * | 1/1994 | Kosugi | 455/119 |
| 5,430,416 A | | 7/1995 | Black et al. | 332/145 |
| 5,589,796 A | * | 12/1996 | Alberth et al. | 330/133 |
| 6,043,707 A | | 3/2000 | Budnik | 330/10 |
| 6,236,267 B1 | | 5/2001 | Anzil | 330/149 |

FOREIGN PATENT DOCUMENTS

| WO | WO 00/30245 | 5/2000 |
| WO | WO 00/35080 | 6/2000 |

* cited by examiner

Primary Examiner—Nguyen T. Vo

(74) *Attorney, Agent, or Firm*—Trop, Pruner & Hu, PC

(57) ABSTRACT

The invention provides a method and a device for amplitude modulation of a radio frequency signal using a variable-gain radio frequency power amplifier, for automatic control of the amplifier output signal by generating an error signal between an amplitude modulation signal and a signal representing the power of the amplifier output signal, from which a gain control signal of the amplifier is generated, to monitor potential saturation of the amplifier by comparing the relative phases of the error signal and of the amplitude modulation signal, and, in case of saturation of the amplifier, to generate a correction signal for lowering the operating point of the amplifier. The invention is applicable to a transmitter of a mobile station or a fixed station of a radio communication system.

24 Claims, 9 Drawing Sheets

FIG. 1
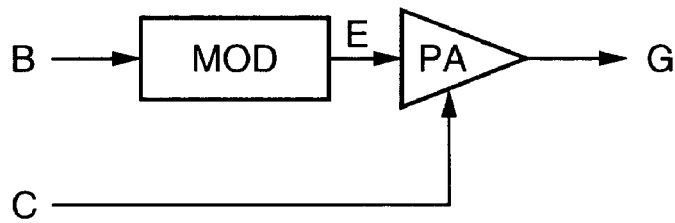
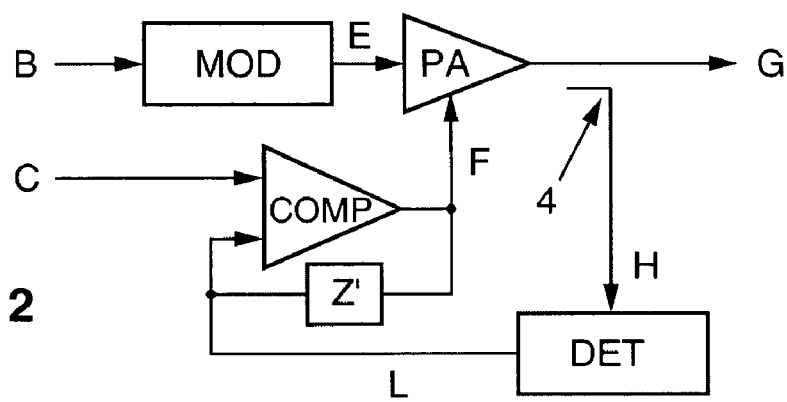
FIG. 2
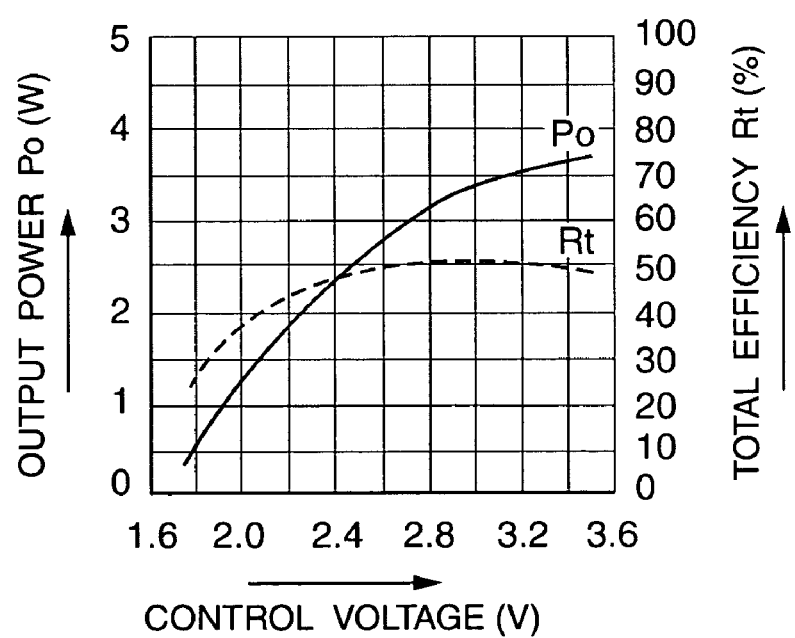
FIG. 5

FIG. 13
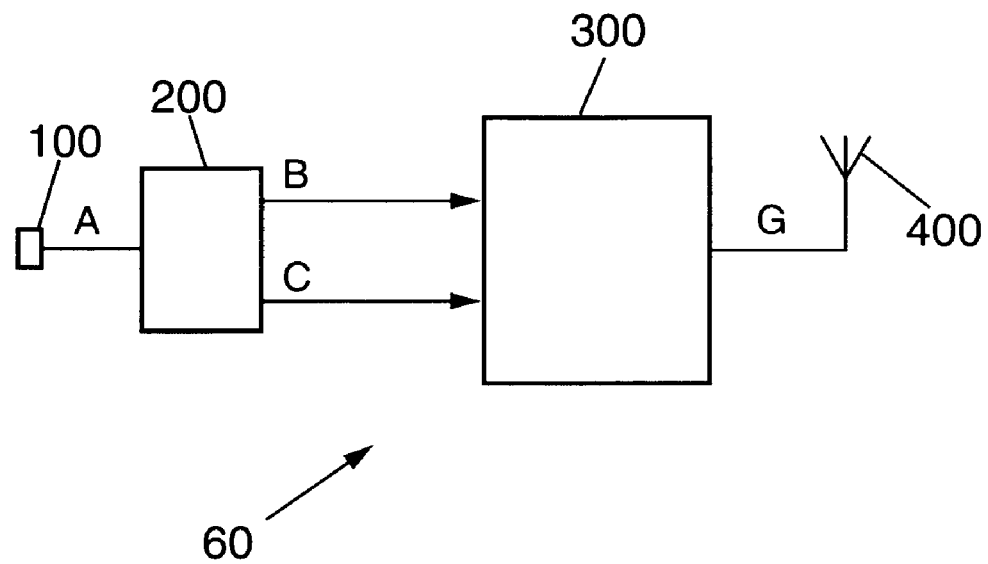
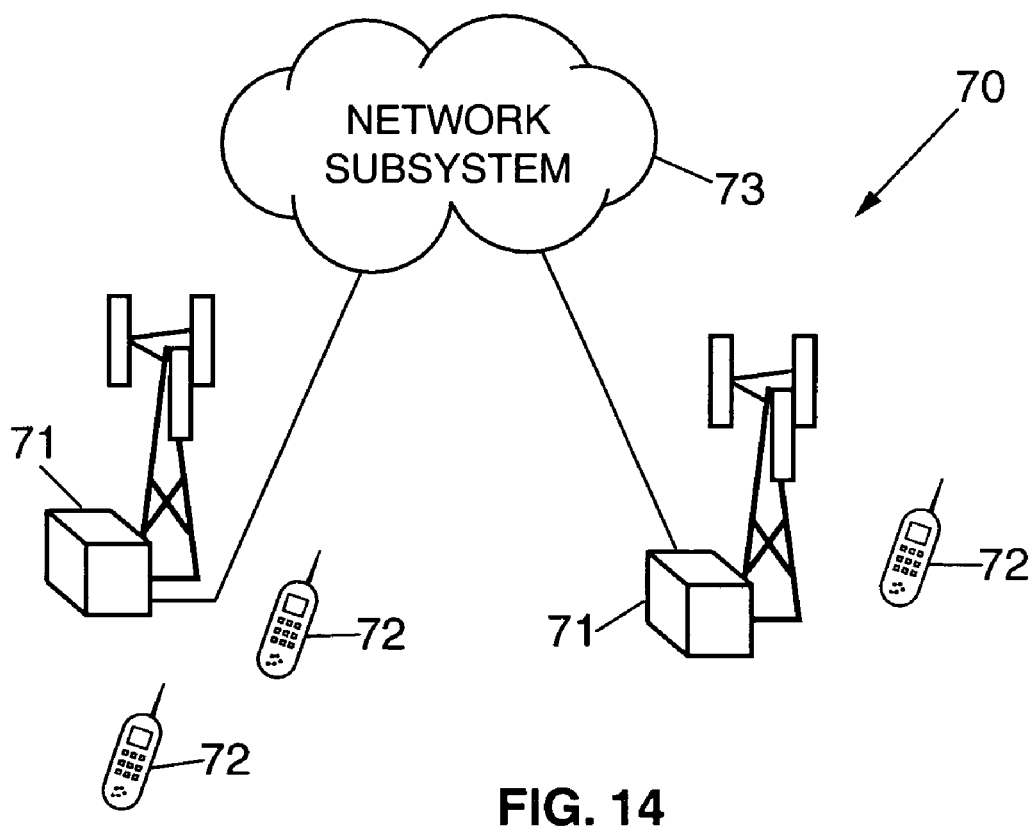
FIG. 14

METHOD FOR AMPLITUDE MODULATION OF A RADIO FREQUENCY SIGNAL, AND DEVICE THEREFOR

TECHNICAL FIELD

The present invention relates to a method of amplifying and modulating the amplitude of a radiofrequency signal, to a device for implementing the method and to a generator comprising such a device for generating a radiofrequency signal comprising a phase or frequency modulation component and an amplitude modulation component, a radiofrequency transmitter incorporating such a generator, and also a mobile station and a fixed station of a radiocommunication system comprising such a transmitter.

The invention relates to the field of the techniques for amplifying radiofrequency signals comprising, on the one hand, a phase or frequency modulation component and, on the other hand, an amplitude modulation component, which are suitable for radio transmission via an antenna or a cable.

The invention finds applications in radiofrequency transmitters, especially mobile stations or fixed stations of a radiocommunication system, for example a private mobile radiocommunication system (or PMR).

BACKGROUND OF THE INVENTION

In radiocommunication systems of this type, digital data encoding an audio signal or, more generally, information of any type, are transmitted by means of an amplitude modulation which takes place in addition to a phase or frequency modulation of the transmitted radiofrequency signal. Thus, the transmitted radiofrequency signal has both a phase or frequency modulation component and an amplitude modulation component. Adding an amplitude modulation component makes it possible in general to improve the bit rate characteristics for a given channel width.

The output stage of the transmitter comprises a radiofrequency power amplifier which, so as to obtain a high power efficiency (this being particularly required in the case of use of a transmitter in portable radiocommunication equipment), must operate within an operating region close to saturation.

Now, as is known, a power amplifier in such an operating region exhibits amplification nonlinearities comprising amplitude nonlinearities and phase non-linearities. In the literature, these nonlinearities are often denoted by amplitude/amplitude conversions (or AM/AM conversions) or amplitude/phase conversions (or AM/PM conversions), respectively. These non-linearities cause distortion of the transmitted signal, which distortion degrades the performance of the transmitter in terms of transmission quality, this loss of quality generally resulting in undesirable broadening of the spectrum.

Various techniques have been proposed for eliminating the effects of the amplification nonlinearities of radiofrequency power amplifiers. These techniques are called radiofrequency power amplifier linearization techniques. In particular, mention may be made of the CLLT (Cartesion Loop Linear Transmitter) technique, the ABP (Adaptive Baseband Predistortion) technique and the EER (Envelope Elimination and Restoration) technique, etc.

The EER technique is very old, since it has been applied since the 50s for amplification of single-sideband (SSB) radiofrequency signals.

The principle of the EER technique is illustrated in FIG. 1, which is a simplified diagram of a radiofrequency signal generator that relies on this technique. The modulation of the radiofrequency signal G output by the generator is decomposed into a phase or frequency modulation component on the one hand, and an amplitude modulation component on the other. These two components are generated in baseband.

In the example shown, a phase modulation component B is delivered, as phase or frequency modulation signal, to the input of phase or frequency modulation means MOD, for example comprising a phase modulator, which transpose it into the radiofrequency range. In a variant of the EER technique, known as the OPLEER (Open Phase Loop EER) technique, the means MOD comprise a phase-locked loop. Such phase modulation means have extremely low broadband noise characteristics because of the high spectral purity that the phase-locked loop can achieve.

The signal E output by the modulation means MOD is a phase-modulated signal of approximately constant amplitude. This signal is then amplified by a radiofrequency power amplifier PA.

An amplitude modulation component C is delivered, as amplitude modulation signal, via circuits (not shown in FIG. 1), to a gain control input of the amplifier PA in order to control the gain of this amplifier. This mechanism allows the amplitude modulation component to be reintroduced into the amplified radiofrequency signal without injecting additional noise. The amplifier PA may be a component having a gain control input or a group of components having a gain control input.

Thus, the amplitude modulation component is superimposed on the phase modulation component in order to obtain the desired radiofrequency signal G as the output of the amplifier PA, these two components using different paths to reach the output of the amplifier PA.

A radiofrequency transmitter relying on the OPLEER technique is described, for example, in French patent application FR 2 716 589. This transmitter includes AM/AM conversion correction means and AM/PM conversion correction means for the radiofrequency power amplifier PA, in the form of an output signal amplitude control loop and an output signal phase control loop, respectively, which are imbricated.

The diagram of FIG. 2 shows AM/AM conversion correction means for the radiofrequency power amplifier PA, in the case of a generator of the type shown in FIG. 1, which are described in the aforementioned document FR 2 716 589.

These means comprise, for example, an analog control loop for feedback control of the output signal G to the amplitude modulation signal C. The analog control loop includes a comparator amplifier COMP, a first input of which receives the amplitude modulation signal C, a second input of which receives a signal L and the output of which delivers an amplitude control signal F. The latter signal is applied to a gain control input of the amplifier PA. The output of the amplifier COMP is fed back to its second input via an impedance, such as a capacitor C so as to prevent spurious oscillations of the signal F. The signal L is an analog signal representative of the power of the output signal G.

The analog control loop further includes coupling means, such as a radiofrequency coupler 4, for extracting part of the energy of the output signal G and delivering a signal H that is the image of the output signal G.

Finally, it includes a detector DET, the input of which receives the signal H and the output of which delivers the aforementioned signal L. The detector DET allows the amplitude modulation component of the output signal G to be extracted from the signal H by applying rectification and low-pass filtering to the signal H so that the voltage amplitude of the signal L, conventionally expressed in decibel-volts (dBv), is a function of the instantaneous power of the signal H, conventionally expressed in decibels (dBm). The signal L is therefore representative of the amplitude modulation component actually present in the output signal G.

The signal L and the amplitude modulation signal C are very close to each other and differ only by the effect of the AM/AM conversions in the amplifier PA. The signal L is compared to the amplitude modulation signal C by the comparator amplifier COMP, which produces the amplitude control signal F on the basis of their difference.

These AM/AM conversion correction means have the drawback of not controlling the operating point of the amplifier PA. Now, should there be a variation in the supply voltage or in the temperature, for example, the operating point of the amplifier PA may be shifted toward the saturation region of the amplifier PA. Saturation of the amplifier PA generates a distortion of the output signal, without this distortion being detected, or a fortiori corrected.

The graph in FIG. 3a shows the variation in the amplitude of the output signal G in a normal operating case, that is to say when the operating point of the amplifier PA is such that, despite the required amplitude modulation, the entire amplitude variation remains below the saturation point. The graph shown in FIG. 3b gives the corresponding spectrum of the output signal G. As a result of a temperature variation or of a variation in the supply voltage, the operating point may be shifted toward the saturation region of the power amplifier. In certain cases, the analog control loop can no longer provide a sufficient excursion of the amplitude control signal F in order to obtain an output signal G having the required amplitude variation. The amplitude variation shown in the graph of FIG. 3c is then obtained. The corresponding spectrum is shown in the graph of FIG. 3d. As may be seen by comparing these Figures to FIGS. 3a and 3b, the distortion by the clipping of the amplitude then results in spectral broadening of the output signal G.

SUMMARY OF THE INVENTION

The invention thus proposes a method of modulating the amplitude of a radiofrequency signal using a variable-gain radiofrequency power amplifier, which makes it possible to detect saturation of the amplifier PA and to lower the operating point of the amplifier so as to reduce the mean power output by the amplifier when the latter saturates.

More particularly, the invention proposes a method of modulating the amplitude of a radiofrequency signal using a radiofrequency power amplifier, comprising the steps consisting:

a) in applying feedback control to the power of the output signal of the amplifier by generating an error signal between an amplitude modulation signal and a signal representative of the power of the output signal of the amplifier, on the basis of which a signal for controlling the gain of the amplifier is generated;

b) in monitoring potential saturation of the amplifier by comparing the relative phases of the error signal and the amplitude modulation signal; and c) should the amplifier saturate, in generating a correction signal for lowering the operating point of the amplifier.

The invention further proposes a device for implementing the method, comprising:

a variable-gain radiofrequency power amplifier;

means for applying feedback control to the power of the output signal of the amplifier, which means generate a signal for controlling the gain of the amplifier on the basis of an error signal between an amplitude modulation signal and a signal representative of the power of the output signal of the amplifier;

means for comparing the relative phases of the error signal and the amplitude modulation signal so as to deduce therefrom potential saturation of the amplifier; and means for, should the amplifier saturate, generating a correction signal for lowering the operating point of the amplifier.

The invention applies in particular to the recovery of the amplitude modulation component by controlling the gain of a radiofrequency power amplifier in a generator relying on the EER technique or on the OPLEER technique, without however its scope being limited to this application.

The invention thus proposes a generator for generating a radiofrequency signal having a phase modulation component and an amplitude modulation component, which comprises:

means for generating a phase or frequency modulation signal and an amplitude modulation signal;

phase or frequency modulation means comprising an input that receives the phase or frequency modulation signal and an output that delivers a phase-modulated or frequency-modulated radiofrequency signal of approximately constant amplitude; and a device as defined above for modulating the amplitude of the radiofrequency signal delivered by the phase or frequency modulation means on the basis of the amplitude modulation signal.

The invention further proposes a radiofrequency transmitter, for example a mobile station or fixed station transmitter of a PMR system, comprising such a generator.

Finally, it proposes a mobile station and a fixed station of a radiocommunication system, for example a PMR system, which comprise such a transmitter, and also a radiocommunication system, for example a PMR system, comprising at least one such mobile station and at least one such fixed station.

BRIEF DESCRIPTION OF THE DRAWINGS

FIG. 1, already discussed is a diagram illustrating the principle of the EER or OPLEER technique;

FIG. 2, also already discussed is a diagram showing an analog control loop for the amplitude of the output signal of the radiofrequency power amplifier;

FIG. 5 is the graph of the output power as a function of a gain control signal for a radiofrequency power amplifier used in the device according to the invention;

FIG. 13 is the diagram of a radiofrequency transmitter according to the invention; and FIG. 14 is the diagram of a radio-communication system according to the invention.

DETAILED DESCRIPTION

Figure 6:
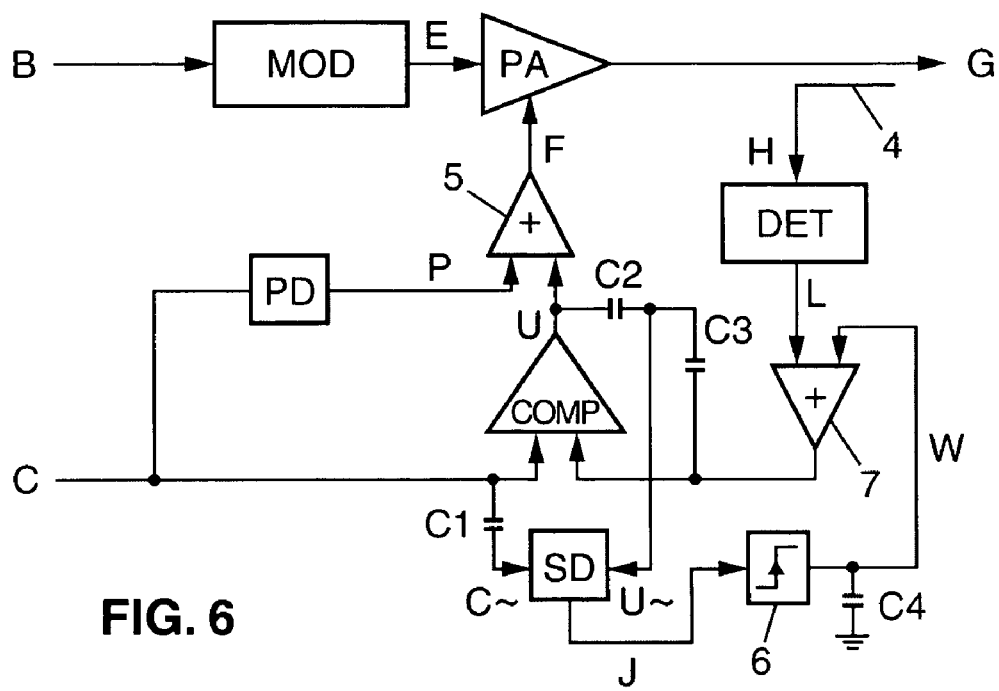
FIG. 6 is the diagram of a radiofrequency signal generator comprising a device according to the invention.

The device according to the invention is shown schematically in FIG. 6, in its application to a generator for generating a radiofrequency signal comprising a phase or frequency modulation component and an amplitude modulation component and being suitable for radio transmission via an antenna or a cable, which is based on the OPLEER technique.

The device according to the invention is advantageously, but not necessarily, incorporated into such a generator. The OPLEER technique, which was presented in the introduction with regard to the diagram of FIG. 2, is particularly suitable for the transposition to radiofrequencies and the power amplification of baseband signals having a low depth of amplitude modulation, that is to say a low amplitude variation.

Figure 3A:
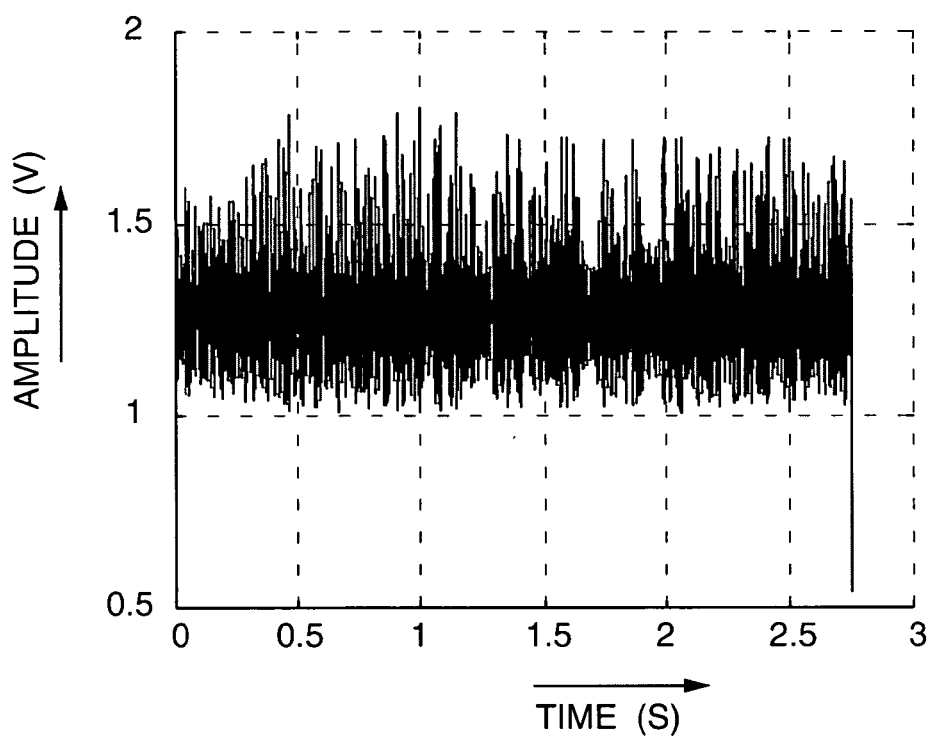
FIGS. 3a and 3b on the one hand and FIGS. 3c and 3d on the other, again already discussed, are graphs showing the variation in amplitude and the spectrum of the output signal in the absence of saturation and in the presence of saturation of the amplifier, respectively.
Figure 3B:
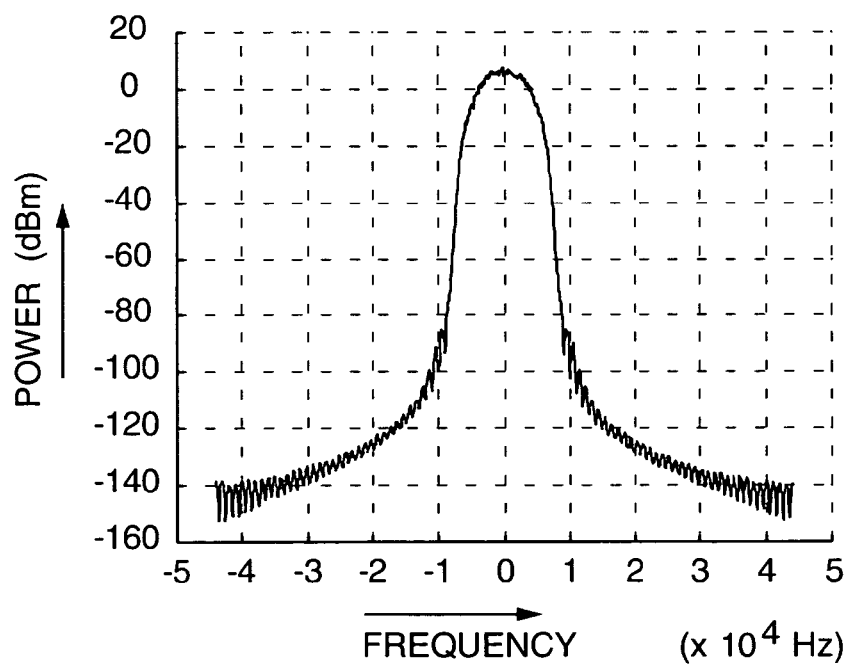
Figure 3C:
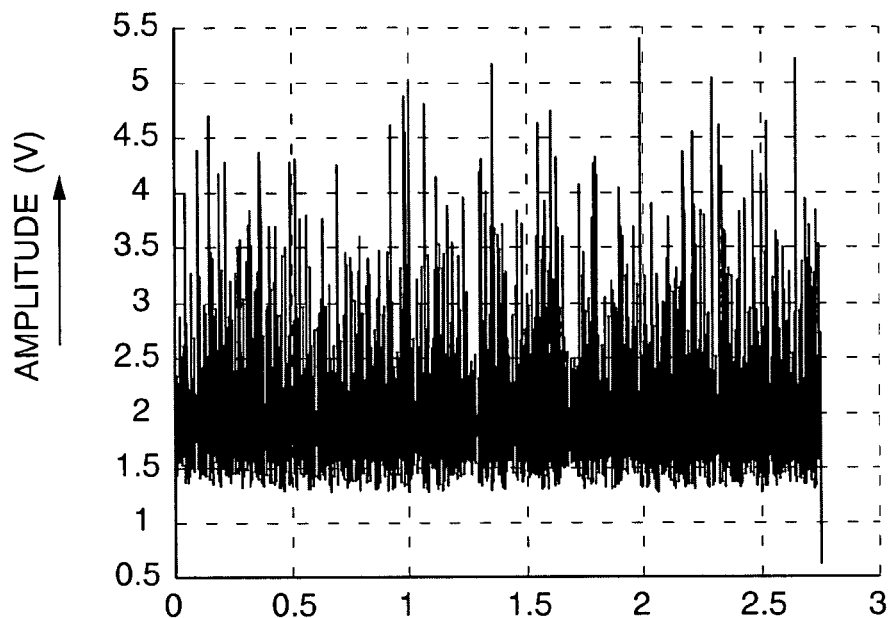
Figure 3D:
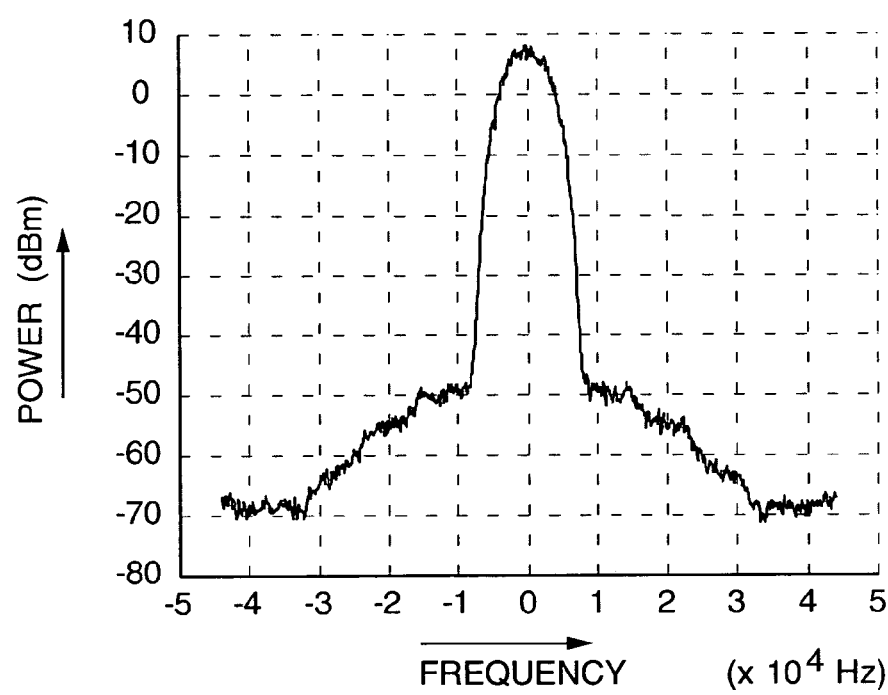
Figure 4A:
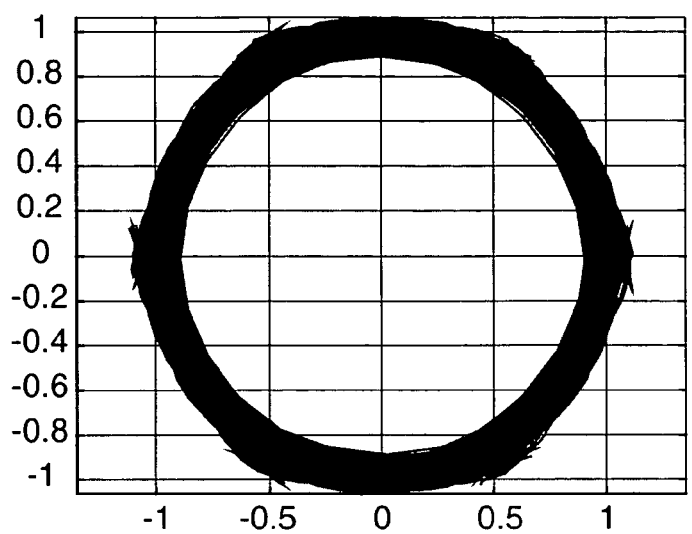
FIGS. 4a to 4c are graphs showing a constellation, the spectrum and the amplitude variation, respectively, of a radiofrequency signal having a phase or frequency modulation component and an amplitude modulation component.
Figure 4B:
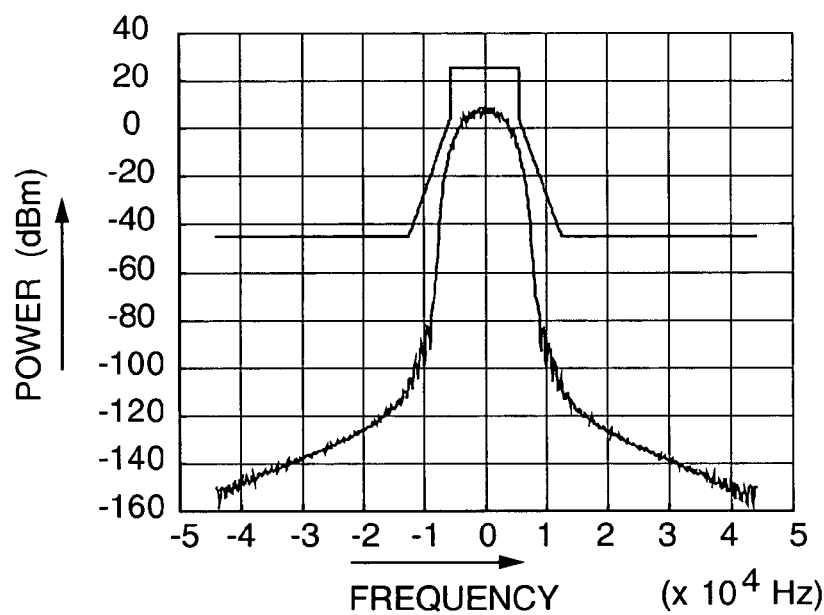
Figure 4C:
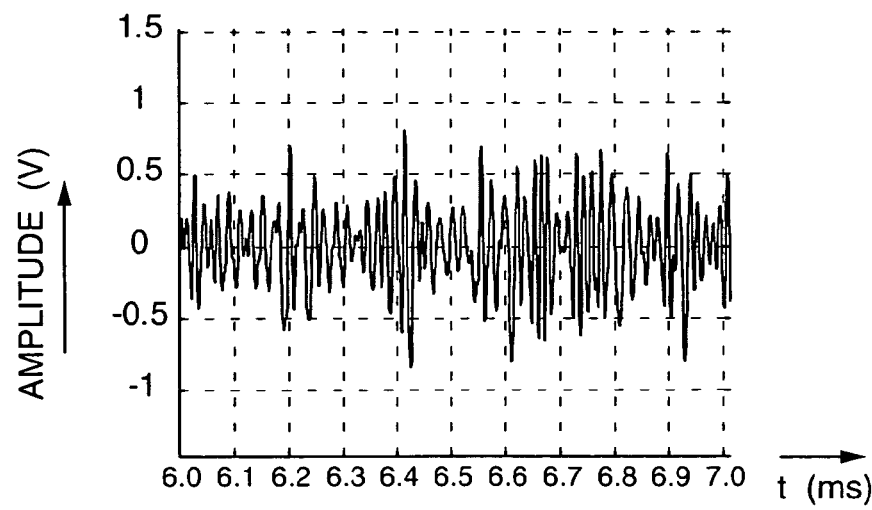

An example of such a baseband signal is shown in the graphs of FIGS. 4a, 4b and 4c. These Figures show the constellation, the spectrum and the amplitude variation (centred about a zero mean value) of the signal, respectively. This signal is, for example, obtained by phase and quadrature filtering (I and Q filtering) of a pulse-width modulated signal (code pulse modulation or CPM). It constitutes a good compromise between spectral occupancy and sensitivity relative to the noise. The total amplitude variation does not exceed ±1 dB, with a ratio of peak power to rms power of less than ±1 dB.

The generator includes means for generating a phase or frequency modulation signal B and an amplitude modulation signal C.

In the example described below, a phase modulation component is envisioned that is obtained by frequency conversion on the basis of the I and Q components of the corresponding baseband signal. This component is thus defined by the phase or frequency modulation signal B, which is an analog signal. However, it should be noted that the phase modulation component may also be obtained by direct digital generation, in which case the signal B would be a digital signal. Likewise, the example of an amplitude modulation component, which is obtained by rectifying the corresponding baseband signal, may be envisioned. This component is then defined by the amplitude modulation signal C, which is an analog signal. However, it should be noted that this component may also be obtained by direct digital generation, in which case the signal C would be a digital signal. In practice, the signals B and C are delivered to the generator by upstream encoding means.

The amplitude modulation signal C contains a DC component $V_{C=}$, which allows the mean power level output by the amplifier PA to be defined, and an AC component $V_{C\sim}$, which defines the actual amplitude modulation.

For producing the phase or frequency modulation means MOD, the generator comprises a phase-locked looped as described in document FR 2 716 589 cited in the introduction.

To produce the radiofrequency power amplifier PA, the device advantageously comprises a field-effect transistor (FET) having characteristics such as those shown in the graph of FIG. 5. An amplifier of this type has the advantage, firstly, of having a curve of the output power Po that is linear over a wide gain control voltage range and, secondly, of having a total efficiency $E_t$ that reaches its maximum value for a control voltage corresponding to an operating point sufficiently away from the saturation point. In this way, a signal of the type illustrated in FIGS. 4a, 4b and 4c may be amplified without the overall efficiency of the amplification being reduced relative to the amplification of a constant-amplitude signal at the saturation point or beyond.

The device further includes a comparator amplifier COMP, operating as an error amplifier. This is, for example, an operational amplifier. The amplifier COMP produces an error signal U, namely the error between the amplitude modulation signal C and a signal L that is representative of the power of the output signal G of the amplifier PA. The signal L is produced by a detector DET on the basis of a signal H extracted from the output of the amplifier PA by a coupler 4. The inverting input of the amplifier COMP, which receives the signal L (in this case via a summing amplifier 7 to which reference will be made later), is connected to its output via two capacitors C2 and C3 in series. These capacitors block the spurious oscillations of the output of the amplifier COMP.

The signal U may be applied to a gain control input of the amplifier PA. The aforementioned elements of the device according to the invention therefore form means for applying feedback control to the power of the output signal G of the amplifier PA, which means are known per se and are similar to the corresponding elements of the generator shown in FIG. 2.

However, in a variant shown, means for applying feedback control to the power of the output signal G of the device according to the invention further include a summing amplifier 5, operating as an analog adder. The amplifier 5 produces a signal F for controlling the gain of the amplifier PA, which signal is supplied to the gain control input of the amplifier PA. The signal F is produced by the amplifier 5 by adding the error signal U, on the one hand, to the amplitude modulation signal C or a signal P, on the other hand, which signal P is obtained from said signal C by applying to it a predistortion by means of a predistortion module PD. The advantage of the predistortion module PD is as follows. When an amplitude modulation signal is applied to the input of the gain control of the amplifier PA, this creates a distortion by nonlinearity. This distortion may be at least partly compensated for by applying a predistortion to the amplitude modulation signal, which compensates for these nonlinearities.

The signal P output by the predistortion module PD, that is to say the amplitude modulation signal C with predistortion, is a signal that is in phase with the signal C. It corresponds to the control voltage that must be applied to the gain control input of the amplifier PA under nominal conditions so that the power of the output signal G corresponds to the desired value.

Figure 7:
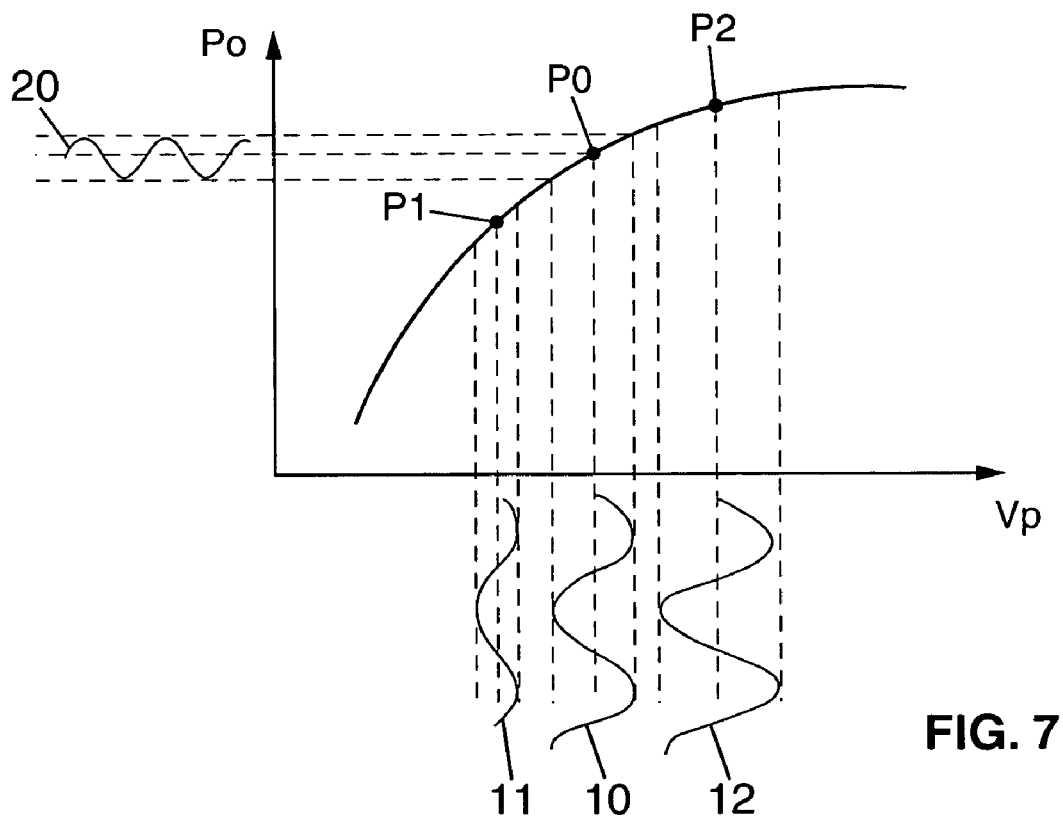
FIG. 7 is a graph illustrating the effects of a shift in the operating point of the radiofrequency power amplifier of a device according to the invention.

The graph of FIG. 7 shows the characteristic of the amplifier PA, that is the curve of the output power Po as a function of the control voltage $V_P$ applied to the gain control input. This graph illustrates the role of the means for applying feedback control to the amplitude of the output signal G.

The aforementioned nominal conditions correspond to an operating point FP0. Under these nominal conditions, to obtain an output signal G with a given amplitude variation, shown in FIG. 7 by curve 20, it is necessary to apply a control signal F, having a given amplitude variation shown in FIG. 7 by curve 10, to the gain control input of the amplifier PA.

If, however, for example because of a variation in the supply voltage or in the temperature, the operating point of the amplifier PA moves up the characteristic, the slope of the function Po=f($V_P$) decreases. Thus, for example, at the operating point labeled PF2 on the graph in FIG. 7, a control signal F having the amplitude variation shown by curve 12, which is greater than that shown by curve 10, has to be applied to the gain control input of the amplifier PA. Conversely, if the operating point of the amplifier PA moves down the characteristic, the slope of the function Po=f($V_P$) increases. As a result, for example at the operating point labeled PF1 on the graph of FIG. 7, a control signal F having the amplitude variation shown by curve 11, which is smaller than that shown by curve 10, has to be applied to the gain control input of the amplifier PA. The means for applying feedback control to the amplitude of the output signal G normally make it possible to generate the amplitude control signal F that has to be applied to the gain control input of the amplifier PA in order to obtain the desired amplitude variation of the output signal G.

According to one finding, which is at the basis of the invention, it is possible, by observing the relative phases of the error signal U on the one hand and of the amplitude modulation signal with predistortion (signal P) or without predistortion (signal C) on the other, to make the following comments. When these two signals are in phase opposition, the amplitude variation of the amplitude modulation signal is greater than the value normally required at the operating point PF0. This is because the error signal U then has the effect of reducing the amplitude control signal F, ensuring that the power of the output signal G complies with the desired value. The effective operating point is in this case in a lower position than that of the operating point PF0 under the nominal conditions. Conversely, if the error signal U on the one hand, and the amplitude modulation signal with predistortion (signal P) or without predistortion (signal C) on the other, are in phase, the amplitude variation of the amplitude modulation signal is greater than the value normally required at the operating point PF0. This is because the error signal U then tends to increase the amplitude control signal F. The effective operating point is in this case in a higher position than that of the operating point PF0 under the nominal conditions.

If the effective operating point is located too high up on the characteristic of the amplifier PA, the error signal U may potentially be unable to achieve an excursion sufficient to provide the amplitude variation of the control signal F to be applied to the gain control input of the power amplifier. The effective operating point is then in the saturation region. In other words, the amplifier PA is saturated.

As a consequence of the above findings, the invention suggests that the relative phases of the error signal U and the phase modulation signal C, or the phase modulation signal with predistortion P, be compared so as to deduce therefrom any potential saturation of the amplifier PA.

For this purpose, the device according to the invention further includes means for comparing the relative phases of the error signal U and the amplitude modulation signal C. These means comprise means for the synchronous detection of the AC component $V_{U\sim}$ of the error signal U relative to the AC component $V_{C\sim}$ of the amplitude modulation signal C, which means produce a signal J. They further include means for comparing the signal J to a threshold, which comparison means, should amplifier PA be saturated by the threshold being exceeded, generate a correction signal W for lowering the operating point of the amplifier PA.

The synchronous detection means comprise a synchronous detector SD having at least two inputs and one output. A first of these inputs receives the AC component $V_{U\sim}$ of the error signal U that is extracted by the capacitor C2. A second of these inputs receives the AC component $V_{C\sim}$ of the amplitude modulation signal C via a capacitor C1. The output delivers the aforementioned signal J.

Figure 8A:
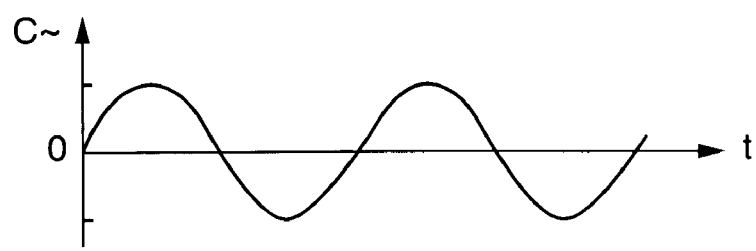
FIGS. 8a to 8f are graphs illustrating the comparison of the relative phases of the error signals and of the phase modulation signal according to the invention.
Figure 8B:
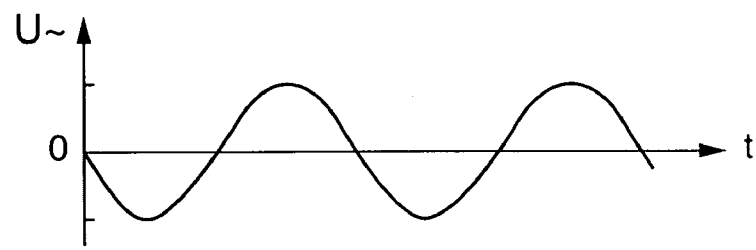
Figure 8C:
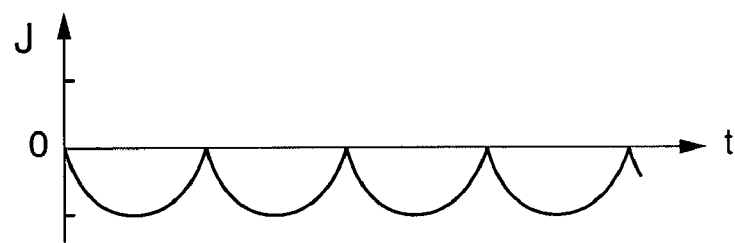
Figure 8D:
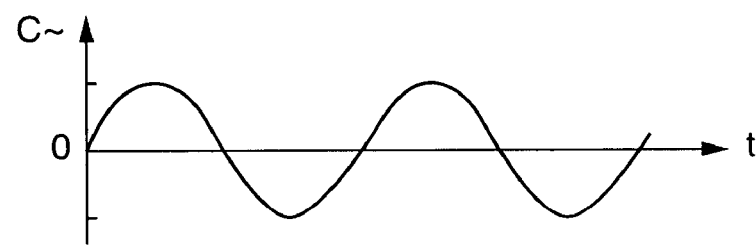
Figure 8E:
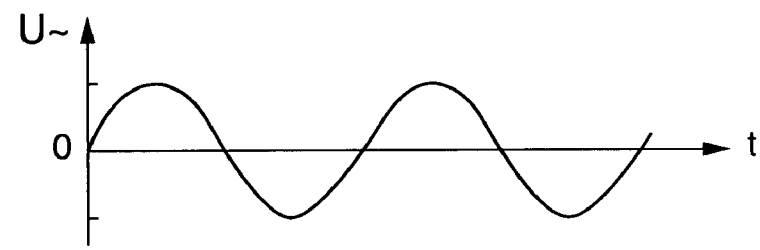
Figure 8F:
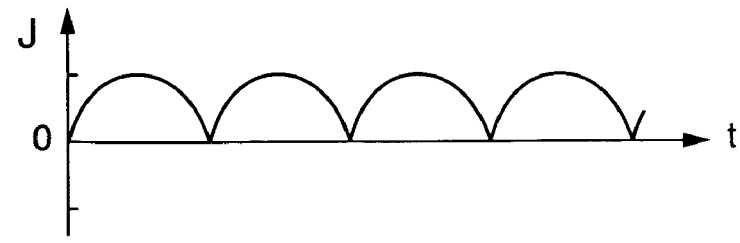

The graphs of FIGS. 8a, 8b and 8c provide a representation of the AC component $V_{C\sim}$ of the amplitude modulation signal C, the AC component $V_{U\sim}$ of the error signal U and the signal J output by the synchronous detector SD, respectively, in the case in which the two aforementioned AC components are in phase opposition. The graphs of FIGS. 8d, 8e and 8f provide an equivalent representation in the opposite case, in which the aforementioned two AC components are in phase.

As may be seen in these graphs, the signal J output by the synchronous detector SD corresponds to the error signal U during the positive half-cycles of the amplitude modulation signal C and, conversely, to the error signal U during the negative half-cycles of the amplitude modulation signal C. As will have been understood, it is determined that the amplifier PA has saturated when the signal J is positive and above a certain threshold.

The means for comparing the signal J to a threshold, which are used for this determination, comprise, for example, a comparator 6 or a Schmitt trigger or the like. The output signal of the comparator 6 is filtered by a smoothing capacitor C4 or an integrator circuit or the like. The correction signal W is the signal at the terminals of this smoothing capacitor C4.

The threshold of the comparator 6 depends on the nominal operating point PF0 of the amplifier PA, which is determined by the DC component $V_{C=}$ of the amplitude modulation signal C.

The device further includes means, such as the summing amplifier 7 mentioned earlier, which operates as an anlog adder in order to add the correction signal W to the signal L representative of the power of the output signal G of the amplifier PA. Thus, the correction signal W, which is a DC signal, has the effect of simulating an increase in the DC component of the output signal G, in such a way that the means for applying feedback control to the amplitude of the output signal G act by lowering the operating point of this amplifier.

Figure 9:
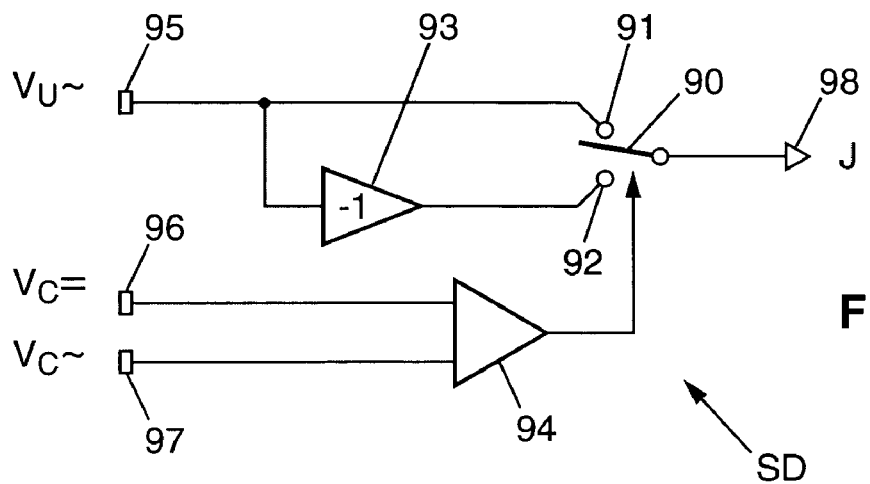
FIG. 9 is the diagram of a first illustrative example of a synchronous detector according to the invention.

The diagram of FIG. 9 shows an illustrative example of the synchronous detector SD.

In this example, the detector includes a two-position switch 90. In the first position 91, the switch 90 delivers the AC component $V_{U\sim}$ of the error signal U, received on a first input 95 of the detector, to the output 98 of the detector. In the second position 92, the switch 90 delivers this AC component $V_{U\sim}$ to the output 98 after said AC component $V_{U\sim}$ has been inverted by means of an inverter amplifier 93.

The inverter amplifier 93 is, for example, a circuit that includes an operational amplifier, the gain of which is equal to −1.

The switching of the switch 90 from one of the positions 91 and 92 to the other is controlled by an activation signal delivered by a comparator amplifier 94 that receives, as input, the DC component $V_{C=}$ and the AC component $V_{C\sim}$ of the amplitude modulation signal C, these components being received on a second input 96 and a third input 97 of the detector, respectively.

It should be noted that the DC component $V_{C=}$ of the amplitude modulation signal C can be easily obtained, for example by subtracting the AC component $V_{C\sim}$ from the amplitude modulation signal C by means that are not shown but are within the competence of a person skilled in the art.

Figure 10:
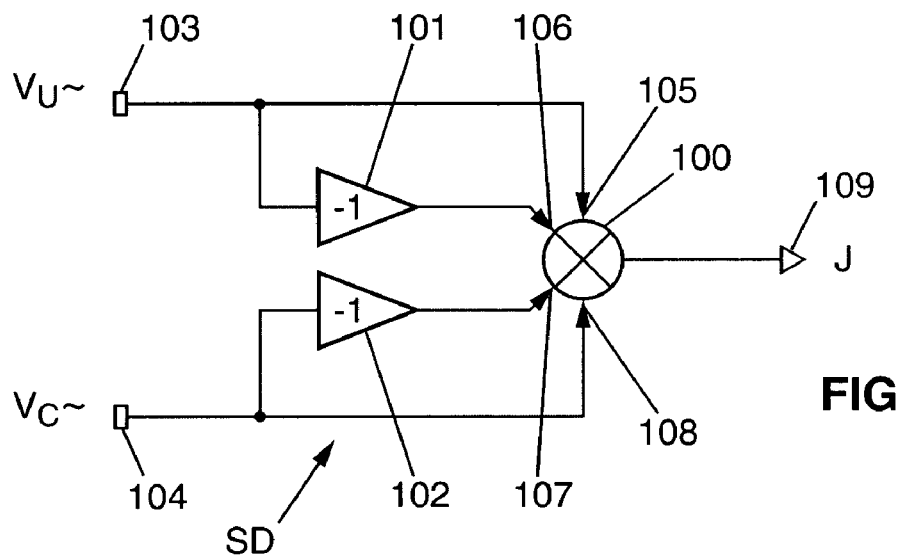
FIG. 10 is the diagram of a second illustrative example of a synchronous detector according to the invention.

The diagram of FIG. 10 shows another illustrative example of the synchronous detector SD.

In this example, the synchronous detector SD includes a symmetrical multiplier 100 with two Gilbert cells. Such a multiplier has four inputs 105, 106, 107 and 108 and one output 109. The output 109 of the symmetrical multiplier delivers the signal J. The symmetrical multiplier 100 is preceded by a matching stage (not shown) similar to that used in quadrature detectors serving to demodulate the frequency modulation.

The AC component $V_{U\sim}$ of the error signal U, received on a first input 103 of the detector SD, is applied to the input 105 and, via an inverting amplifier 101, to the input 106 of the symmetrical multiplier 100. In addition, the AC component $V_{C\sim}$ of the amplitude modulation signal C, received on a second input 104 of the detector SD is applied to the input 107 and, via another inverting amplifier 102, to the input 108 of the symmetrical multiplier 100.

The inverting amplifiers 101 and 102 are, for example, produced by respective circuits each comprising an operational amplifier, the gain of which is equal to −1.

In an advantageous embodiment, the means for applying feedback control to the power of the output signal G of the amplifier PA are designed to produce the signal F for controlling the gain of the amplifier PA by adding the error signal U, after this has been weighted by a weighting parameter k, for example a multiplicative parameter, to the amplitude modulation signal C (or to the signal P corresponding to the amplitude modulation signal C with predistortion). This weighting is obtained by adapting the adding amplifier 5 in such a way that it produces the function C+k.U (or P+k.U). The weighting parameter k depends on the nominal operating point of the amplifier PA, as determined by the DC component $V_{C=}$ of the amplitude modulation signal C.

Figure 11:
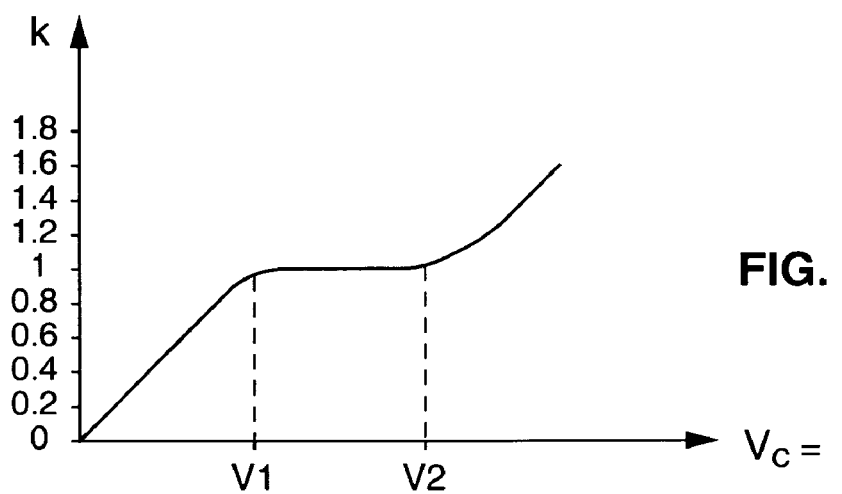
FIG. 11 is the graph of the variation of a weighting parameter used according to the invention.

The typical variation in the value of the weighting parameter k as a function of the DC component $V_{C=}$ of the amplitude modulation signal C is given by the graph of FIG. 11.

For the purposes of the present invention and in what follows, the expression "low values of the DC component $V_{C=}$ of the amplitude modulation signal C" is understood to mean values that are lower than a second defined value V1 below which the detector DET is not linear. In addition, the expression "high value of the DC component $V_{C=}$ of the amplitude modulation signal C" is understood to mean values that are greater than a second defined value V2, above which the gain of the amplifier PA starts to decrease.

For $V_{C=}$ values between the values V1 and V2, the parameter k is preferably equal to unity (k=1) in such a way that the signal U and the signal C (or the signal P) are added without weighting.

For high values of $V_{C=}$, that is to say for values of the mean power of the output signal G that are close to saturation of the power amplifier PA, the value of the parameter k increases so as to compensate for the loss of gain of the amplifier PA (which is a manifestation of the reduction in the slope of the characteristic, shown in FIG. 7, of the amplifier PA). In this way, the loop gain is kept constant, making it easier to produce the low-pass loop filter (not shown) whose cutoff frequency would otherwise vary with the mean power of the output signal G.

For low values of $V_{C=}$, the value of k decreases and becomes zero. Thus, the feedback via the loop comprising the coupler 4 and the detector DET is not used in a region in which the detector might have deviations from linearity and in which the amplifier PA does not have such. Thus, it is possible to use only a detector whose detection linearity region is small, the predistortion itself providing the necessary corrections in the region in which the power amplifier is virtually linear.

Figure 12:
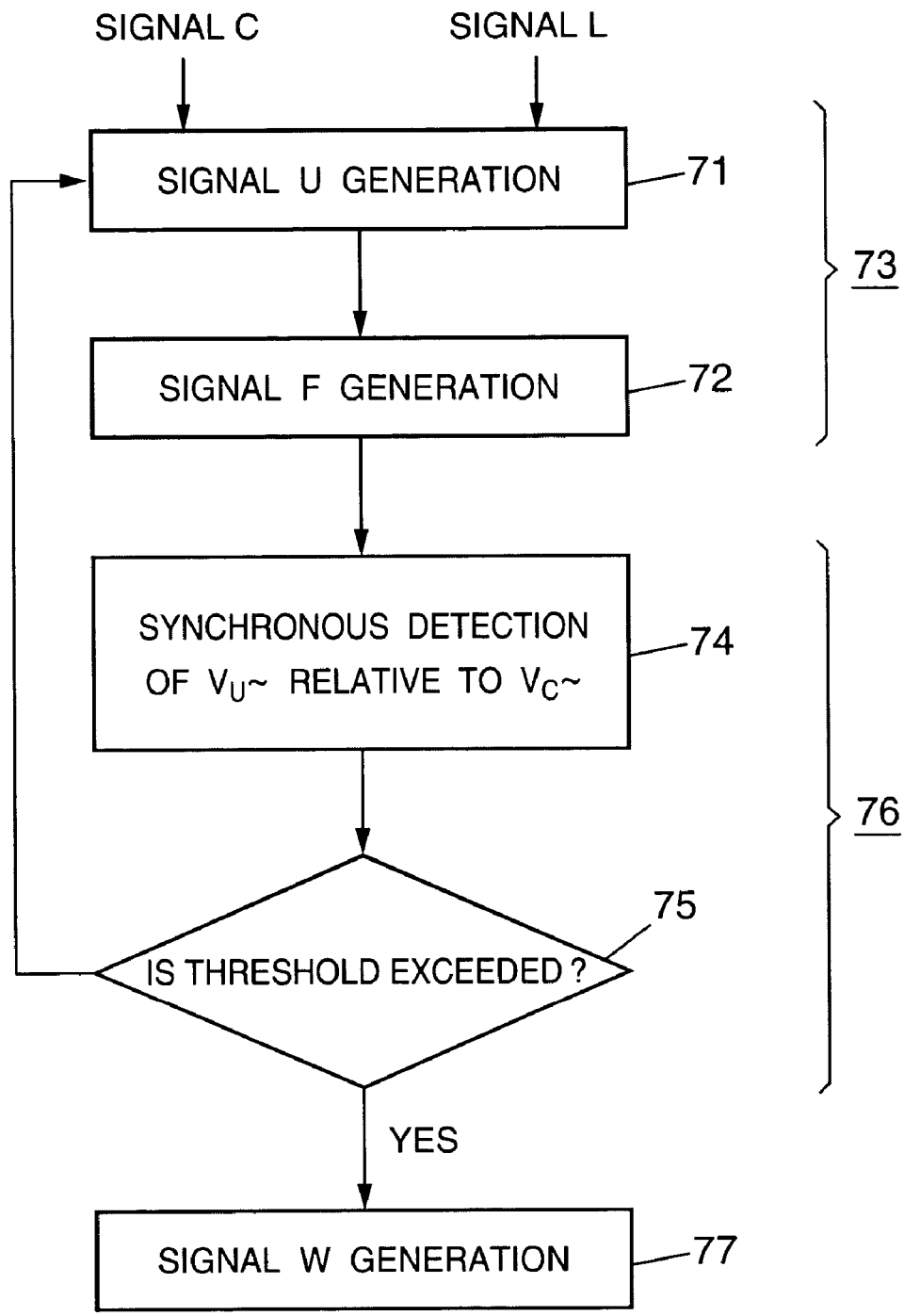
FIG. 12 is a flowchart for the steps of the method according to the invention.

The steps of the method according to the invention are summarized and illustrated by the flowchart of FIG. 12.

In step 73, feedback control is applied to the power of the output signal G of the amplifier PA by generating, in substep 71 of step 73, the error signal U between the amplitude modulation signal C and the signal L representative of the power of the output signal G of the amplifier PA. In substep 72 of step 73, a signal F for controlling the gain of the amplifier PA is generated on the basis of the error signal U. In a first example, the control signal F is generated by adding the error signal U to the amplitude modulation signal C. In a variant of this example, the error signal U is added to the amplitude modulation signal C after predistortion of the latter, that is to say that it is in fact added to the signal P delivered by the predistortion module PD.

In step 76, potential saturation of the amplifier PA is monitored by comparing the relative phases of the error signal U and the amplitude modulation signal C. Should the amplifier PA saturate, a correction signal W is generated in step 77, allowing the operating point of the amplifier PA to be lowered.

In one example, the saturation of the amplifier PA is monitored by substep 74 of step 76, which consists in carrying out synchronous detection of the AC component $V_{U\sim}$ of the error signal U relative to the AC component $V_{C\sim}$ of the amplitude modulation signal C, and by sub-step 73 of step 76, which consists in comparing the signal produced by this detection (this signal is shown in FIGS. 8c and 8f) to a threshold so as to generate, in step 77, the correction signal W when this threshold is exceeded.

Typically, the threshold depends on the DC component $V_{C=}$ of the amplitude modulation signal C.

Advantageously, the correction signal W is added to the signal L representative of the power of the output signal G of the amplifier PA so as to cause the means for applying feedback control to the amplitude of the output signal G to act in order to lower the operating point of the amplifier PA and thus move away from the saturation region of the latter.

Before being added to the amplitude modulation signal C, the error signal U may be weighted by a weighting parameter k that depends on the DC component $V_{C=}$ of the amplitude modulation signal C.

FIG. 13 is the diagram of a radiofrequency transmitter according to embodiment of the present invention.

The transmitter 60 includes a data input 100 for receiving a digital message A containing data to be transmitted. When the transmitter is used in a mobile station or a fixed station of a radiocommunication system, the input 100 may be connected to the output of a speech encoder or of a channel encoder.

The transmitter also includes composite encoding means, such as an encoder 200 for generating, on the basis of the digital message A, a first series of digital values constituting the phase modulation signal B and a second series of digital values constituting the amplitude modulation signal C. In this example, the signal B and the signal C are therefore digital signals.

The transmitter further includes, downstream of the encoder 200, a generator 300 for generating a radiofrequency signal having a phase modulation component and an amplitude modulation component, as described above with regard to FIG. 6.

Finally, the transmitter includes a radiofrequency antenna 400 connected to the output of the generator 300. This antenna transmits the phase-modulated and amplitude-modulated radiofrequency signal G into the transmission channel. As a variant, the antenna 400 may be replaced with a cable.

FIG. 14 shows schematically a radiocommunication system according to one embodiment of the present invention. The system 70 includes a network subsystem, shown symbolically by a cloud 73. It also includes a radio subsystem, comprising mobile stations 71 and/or fixed stations 72. The mobile stations 71 are, for example, portable terminals. The fixed stations 72 are, for example, base stations that provide the radio interface with the mobile stations that fall within their radio coverage area. As a variant, they may be fixed terminals.

At least one fixed station 71 and/or at least one mobile station 72 of the system 70 are equipped with a radiofrequency transmitter 60 according to the diagram of FIG. 12.

The invention claimed is:

1. A method of modulating the amplitude of a radio frequency signal using a radiofrequency power amplifier, comprising:
   a) applying feedback control to the power of the output signal of the amplifier by generating an error signal between an amplitude modulation signal and a signal representative of the power of the output signal of the amplifier, on the basis of which a signal for controlling the gain of the amplifier is generated;
   b) monitoring potential saturation of the amplifier by comparing the relative phases of the error signal and the amplitude modulation signal; and
   c) should the amplifier saturate, then generating a correction signal for lowering the operating point of the amplifier.

2. The method of claim 1, wherein the saturation of the amplifier is monitored by synchronous detection of the AC component of the error signal relative to the AC component of the amplitude modulation signal and comparison of the signal thus detected to a threshold in order to generate the correction signal when the threshold is exceeded.

3. The method of claim 2, wherein the threshold depends on the DC component of the amplitude modulation signal.

4. The method of claim 1, wherein the correction signal is added to the signal representative of the power of the output signal of the amplifier.

5. The method of claim 1, wherein the signal for controlling the gain of the power amplifier is generated by adding the error signal to the amplitude modulation signal.

6. The method of claim 5, wherein the error signal is weighted by a weighting parameter before being added to the amplitude modulation signal, said weighting parameter depending on the DC component of the amplitude modulation signal.

7. The method of claim 6, wherein the weighting parameter is a multiplicative parameter that tends toward zero for low values of the DC component of the amplitude modulation signal.

8. The method of claim 6, wherein the weighting parameter is a multiplicative parameter that increases for high values of the DC component of the amplitude modulation signal so as to compensate for the loss of gain of the amplifier.

9. The method of claim 1 wherein the error signal is added to the amplitude modulation signal after predistortion of the latter.

10. A device for modulating the amplitude of a radiofrequency signal, comprising:
    a variable-gain radiofrequency power amplifier;
    means for applying feedback control to the power of the output signal of the amplifier, which means generate a signal for controlling the gain of the amplifier on the basis of an error signal between an amplitude modulation signal and a signal representative of the power of the output signal of the amplifier;
    means for comparing the relative phases of the error signal and the amplitude modulation signal so as to deduce therefrom potential saturation of the amplifier; and
    means for, should the amplifier saturate, generating a correction signal for lowering the operating point of the amplifier.

11. The device of claim 10, wherein said means for comparing the relative phases of the error signal and the amplitude modulation signal comprise means for the synchronous detection of the AC component of the error signal relative to the AC component of the amplitude modulation signal, and means for comparing the signal produced by these detection means to a threshold, which generate the correction signal when the threshold is exceeded.

12. The device of claim 11, wherein the threshold depends on the DC component of the amplitude modulation signal.

13. The device of claim 10, further comprising means for adding the correction signal to the signal representative of the power of the output signal of the amplifier.

14. The device of claim 10, further comprising means for generating the signal for controlling the gain of the amplifier by adding the error signal to the amplitude modulation signal.

15. The device of claim 14, further comprising means for predistorting the amplitude modulation signal which is added to the error signal.

16. The device of claim 10, wherein the means for applying feedback control to the power of the output signal of the amplifier are designed to produce the signal for controlling the gain of the amplifier by adding the error signal to the amplitude modulation signal after the error signal has been weighted by a multiplicative parameter, said weighting parameter depending on the DC component of the amplitude modulation signal.

17. The device of claim 16, wherein the weighting parameter is a multiplicative parameter that tends toward zero for low values of the DC component of the amplitude modulation signal.

18. The device of claim 16, wherein the weighting parameter is a multiplicative parameter that increases for high values of the DC component of the amplitude modulation signal so as to compensate for the loss of gain of the amplifier.

19. A generator for generating a radiofrequency signal having a phase modulation component and an amplitude modulation component, which comprises:
   means for generating a phase or frequency modulation signal and an amplitude modulation signal;
   phase or frequency modulation means comprising an input that receives the phase or frequency modulation signal and an output that delivers a phase-modulated or frequency-modulated radiofrequency signal of approximately constant amplitude; and
   a device as claimed in any one of claims 10 to 18 for modulating the amplitude of the radiofrequency signal delivered by the phase or frequency modulation means on the basis of the amplitude modulation signal.

20. A radiofrequency transmitter, comprising a generator as claimed in claim 19.

21. A mobile station of a radiocommunication system, comprising a transmitter as claimed in claim 20.

22. A radiocommunication system, comprising a mobile station as claimed in claim 21.

23. A fixed station of a radiocommunication system, comprising a transmitter as claimed in claim 20.

24. A radiocommunication system, comprising a fixed station as claimed in claim 23.

* * * * *